United States Patent [19]
Johnson

[11] 3,959,579
[45] May 25, 1976

[54] APERTURED SEMI-CONDUCTOR DEVICE MOUNTED ON A SUBSTRATE

[75] Inventor: Alfred H. Johnson, Poughkeepsie, N.Y.

[73] Assignee: International Business Machines Corporation, Armonk, N.Y.

[22] Filed: Aug. 19, 1974

[21] Appl. No.: 498,342

[52] U.S. Cl............................. 174/68.5; 29/626; 174/52 FP; 317/101 CC; 317/101 CM; 317/101 A; 357/74; 357/80
[51] Int. Cl.²........................................ H05K 1/18
[58] Field of Search............ 174/52 PE, 52 S, 68.5, 174/DIG. 3, 52 FP; 317/101 CC, 101 CM, 101 CP, 101 A; 29/626; 357/80, 74

[56] References Cited
UNITED STATES PATENTS

| 3,365,620 | 1/1968 | Butler et al. | 317/101 CP |
| 3,374,533 | 3/1968 | Burks et al. | 317/101 CP X |
| 3,457,541 | 7/1969 | Ransil et al. | 174/68.5 X |
| 3,596,140 | 7/1971 | Walsh | 174/68.5 X |
| 3,619,734 | 11/1971 | Assour et al. | 357/80 X |
| 3,648,131 | 3/1972 | Stuby | 174/68.5 UX |

*Primary Examiner*—Darrell L. Clay
*Attorney, Agent, or Firm*—Sughrue, Rothwell, Mion, Zinn & Macpeak

[57] ABSTRACT

An apertured wafer of semi-conductive material having at least one circuit thereon is mounted on a substrate having alternating layers of insulating and conductive material. Wiring connections between the circuit and the layers of conductive material extend through the aperture as well as over the periphery to shorten the length of the wiring connections.

1 Claim, 4 Drawing Figures

APERTURED SEMI-CONDUCTOR DEVICE MOUNTED ON A SUBSTRATE

BACKGROUND OF THE INVENTION

1. Field of the Invention

The present invention relates to wafers or substrates upon which a plurality of integrated circuit chips may be located.

2. Prior Art

In wafer packaging, a concern exists with respect to the effective communication with circuits which are close to the center of the wafer. For memory application, the careful layout of the circuit will assure that most or all of the circuits that communicate off the wafer are near the edge of the wafer. This, however, cannot be readily accomplished for logic wafers since the layouts are more stochastic. Thus, in the past, it has been necessary to run relatively long wires over the surface of the wafer to multiple pad locations which are remote from the perimeter of the wafer. The disadvantage of this approach is the vulnerability of such long wires to damage. The diameter of the wires must of necessity be substantial thereby creating problems in the bonding of wires which have a large cross section. Furthermore, the near location of the long wires over the surface of the wafers creates interference with respect to surface probing or chip repair.

SUMMARY OF THE INVENTION

The present invention provides a wafer package which is provided with one or more apertures remote from the perimeter of the wafer through which wiring extends for connection to circuits which are remote from the perimeter of the wafer. As a result, the length of the longest wire needed is substantially reduced thereby making it possible to substantially reduce the diameter of the wire. The present invention also results in a saving of space and reduction in complexity by reducing the number of drivers that are needed for internal circuits to reach the perimeter. The complexity of the wiring will be substantially reduced while at the same time permitting an increase in the number of inputs and outputs for the wafer. Finally, the present invention provides a wafer packaging arrangement wherein the apertured wafer may be mounted on a multi-layered ceramic substrate or on an epoxy glass printed circuit substrate to provide for efficient voltage distribution to wires extending from the surface of the wafer to the substrate over the perimeter of the wafer and through the aperture or apertures in the wafer.

The foregoing and other objects, features and advantages of the invention will be apparent from the following more particular description of a preferred embodiment of the invention as illustrated in the accompanying drawings.

DETAILED DESCRIPTION OF THE INVENTION

Figure 1:
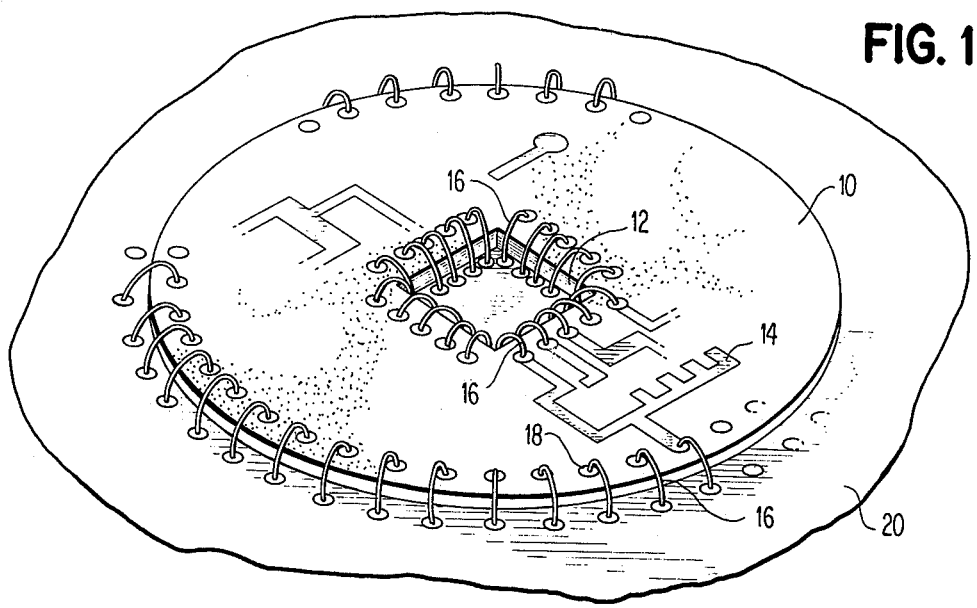
FIG. 1 is a perspective view of an apertured wafer mounted on a substrate and representative wiring connections between the surface of the wafer and the surface of the substrate.

The circular wafer 10 as shown in FIG. 1 is provided with a rectilinear aperture 12 located substantially in the middle thereof to define a donut-shaped wafer. The wafer 10 may be a semiconductor substrate of silicon or the like in which are formed a plurality of active and passive semiconductor devices. An example of such a wafer or masterslice is disclosed in U.S. Pat. No. 3,751,720 to Nestork.

The aperture 12 may be formed by techniques such as etching from both sides by a 4:1 mixture of nitric acid and hydrofluoric acid using photoresist as a mask, abrasive cutting with a tool such as an abrasive cutter manufactured by S. S. White Corporation, or laser machining a hole or perimeter of a hole.

Figure 3:
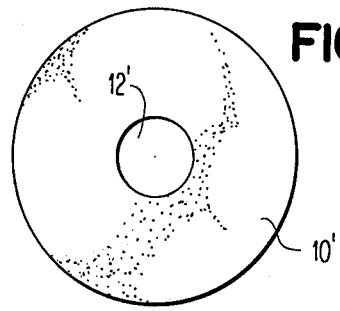
FIG. 3 is a plan view of a modified wafer showing an aperture with the wiring omitted.
Figure 4:
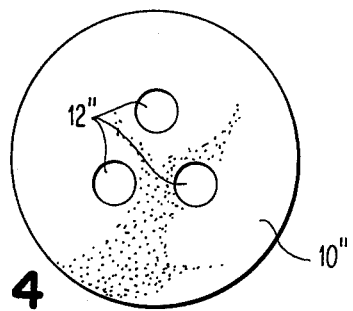
FIG. 4 is a plan view of another modified wafer having a plurality of apertures with the wiring omitted.

As shown in FIGS. 3 and 4 the external periphery of the wafers 10' and 10'' as well as the shape of the aperture 12' could readily have other configurations and a plurality of apertures 12'' could also be located in the wafer depending upon the specific circuit needs. A representative integrated circuit is shown at 14 and two of the plurality of voltage distribution wires 16 which are shown extending over the outer periphery of the wafer 10 and through the aperture 12 are connected to the circuit 14.

In the example illustrated the presence of the aperture 12 in the center of the circular wafer 10 effectively cuts in half the distance of the worst case circuit from the edge of a non-apertured wafer. Although there is a slight decrease in the available space on the wafer as a result of the aperture there is a corresponding increase in the number of inputs and outputs for the wafer. For example, if the aperture 12 was a circular hole having a 0.25 inch diameter and the diameter of the wafer was 3.25 inches there would be a 0.6% decrease in the available wafer area. However, the greatest distance of the worst point on the wafer from an edge would decrease from 1.625 inches into 0.75 inch. The input-output count from the wafer, assuming a 0.2 inch center distance between input-output pads 18 would increase from 510 to 549. The input-output connections are made by thermal compression bonds, decals or other standard, well known technologies.

Although this technique can be used to further decrease the distance to an edge or provide more input-output capability by adding four apertures in various patterns, a single aperture in the center provides the greatest gain per hole of equal area.

Figure 2:
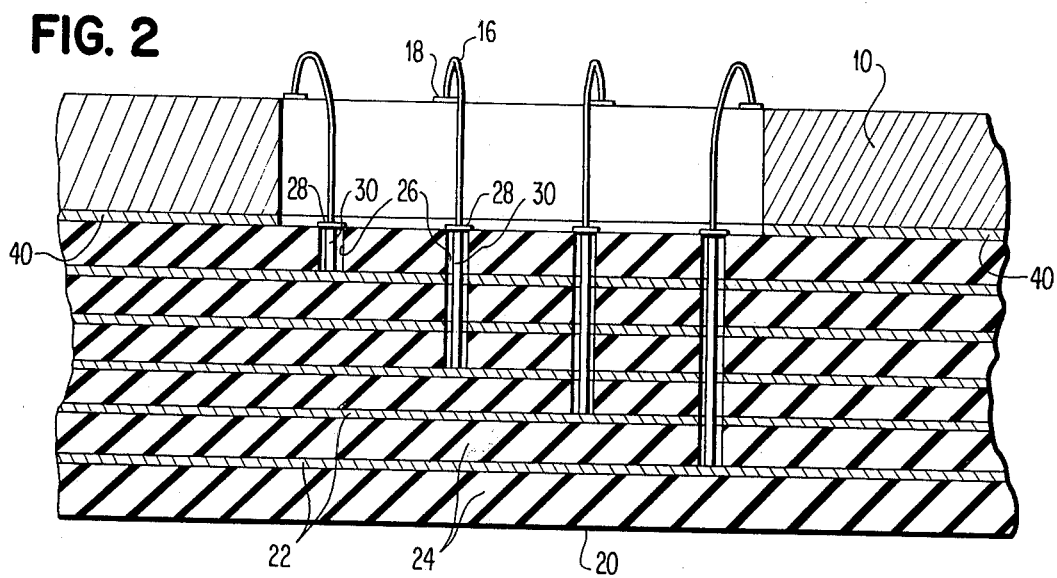
FIG. 2 is a partial sectional view through the apertured wafer of FIG. 1 showing selected wiring connections between the wafer and the substrate through an aperture in the wafer.

The representative substrate 20 is shown in section in FIG. 2 the substrate 20 can be of multi-layered ceramic material or epoxy glass wherein alternating layers of conductive material 22 are alternated with insulating layers 24 to define the substrate. A plurality of apertures 26 extend through the substrate to the desired conductive layer 22 and suitable electrical connectors 30 extend through the holes between the conductive layer and the contact pad 28 on the upper surface of the substrate. The wafer 10 should be in intimate heat conductive contact with the substrate 20 and in order to accomplish this may be secured to the substrate 20 by a gold eutectic bond, soldering or by a thermally conductive plastic material shown schematically at 40. The bond 40 is exaggerated in thickness and in practice the wafer 10 would only be separated from the substrate by a thin layer of the bonding material.

While the invention has been particularly shown and described with reference to a preferred embodiment thereof it would be understood by those skilled in the art that various changes in form and detail may be made therein without departing from the spirit and scope of the invention.

What is claimed is:

1. A semiconductor wafer device comprising a semiconductor wafer having a plurality of circuit means on at least one surface thereof, said wafer having at least one aperture extending through said wafer and spaced inwardly from the periphery, substrate means, means connecting said wafer to said substrate in heat conductive relation therewith, said substrate means comprising alternate layers of insulating and conducting material, wiring connection means connected to said circuit means, extending through each aperture and connected to at least a selective one of said layers of conducting material and additional wiring connection means connected to said circuit means, extending over the periphery of said wafer and connected to at least a selected one of said layers of conductive material.

* * * * *